United States Patent
Betts

(10) Patent No.: US 7,245,162 B1
(45) Date of Patent: Jul. 17, 2007

(54) APPARATUS AND METHOD FOR HEADROOM COMPENSATION USING DYNAMIC TRANSCONDUCTANCE ENHANCEMENT

(75) Inventor: Richard F. Betts, Seattle, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 4 days.

(21) Appl. No.: 10/943,367

(22) Filed: Sep. 17, 2004

Related U.S. Application Data

(60) Provisional application No. 60/504,250, filed on Sep. 17, 2003.

(51) Int. Cl.
*H03K 3/00* (2006.01)

(52) U.S. Cl. ...................... 327/108; 330/288

(58) Field of Classification Search ........ 327/108–112; 330/288
See application file for complete search history.

(56) References Cited

U.S. PATENT DOCUMENTS 5,675,278 A * 10/1997 Tanaka et al. .............. 327/333

6,812,768 B2 * 11/2004 Kawasaki et al. .......... 327/333

OTHER PUBLICATIONS

"Analysis and Design of Analog Integrated Circuits"; Gray et al.; Fourth Edition 2001; pp. 253-254, 260-261.

* cited by examiner

*Primary Examiner*—Kenneth B. Wells
(74) *Attorney, Agent, or Firm*—Marger Johnson & McCollom P.C.

(57) ABSTRACT

An output stage circuit may include a sourcing driver device, a nonlinear local feedback loop having a feedback transistor and a first current mirror, a sinking driver device, and an output signal. The output stage circuit may actively and dynamically adjust the transconductance of the sourcing driver device by sensing its region of operation, and by sending a nonlinear feedback signal through the local feedback loop and the first current mirror. The nonlinear local feedback loop may be used for control and headroom compensation of the sourcing driver transistor to provide low distortion operation using a smaller size driver transistor.

14 Claims, 2 Drawing Sheets

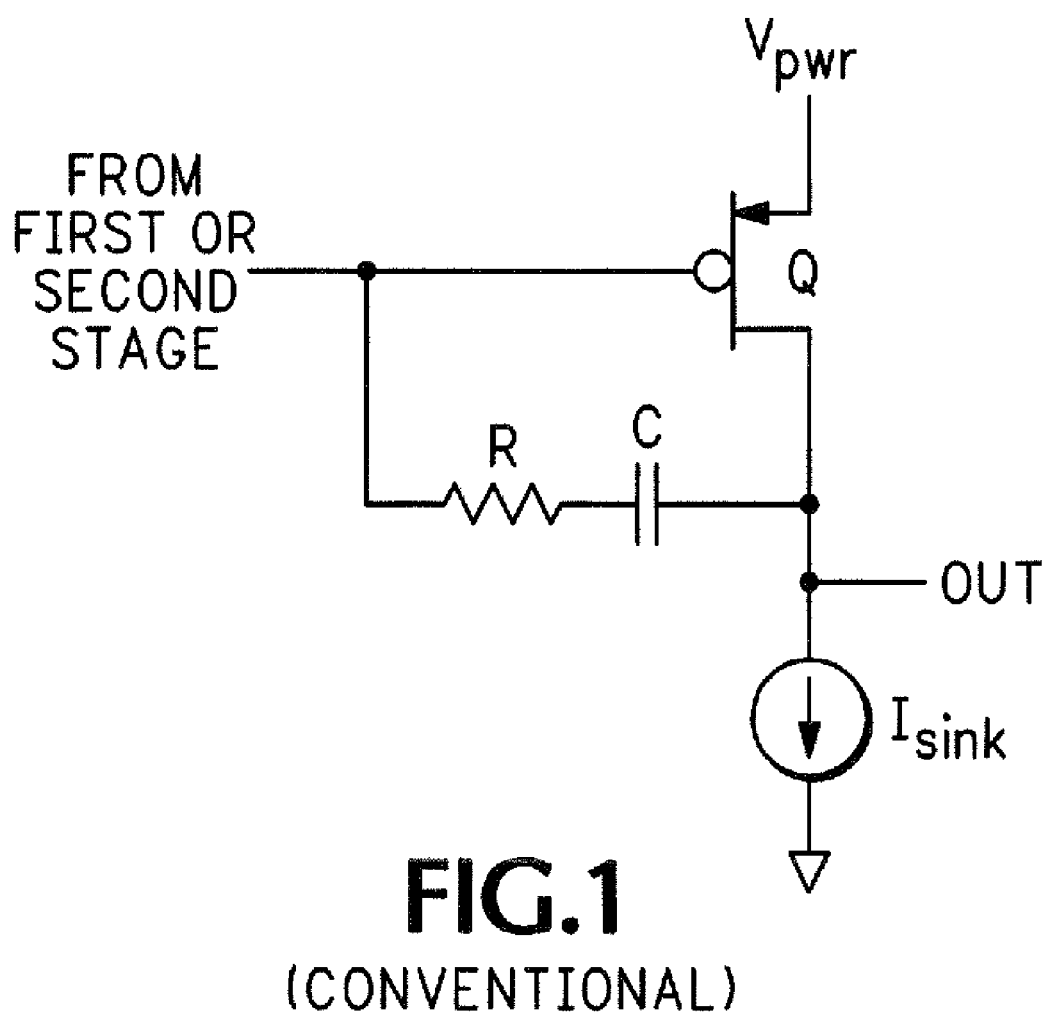
FIG.1
(CONVENTIONAL)

APPARATUS AND METHOD FOR HEADROOM COMPENSATION USING DYNAMIC TRANSCONDUCTANCE ENHANCEMENT

CROSS REFERENCE TO RELATED APPLICATIONS

This application claims priority from U.S. Provisional Patent Application Ser. No. 60/504,250, which was filed on 17 Sep. 2003. Provisional Patent Application 60/504,250 is specifically incorporated by reference in its entirety for all purposes.

BACKGROUND OF THE INVENTION

1. Technical Field of the Invention

This disclosure relates generally to electronic circuits, and in particular, to circuits for nonlinear headroom compensation.

2. Description of the Related Art

Conventional solutions for wide-swing output stage designs use common-source output gain stages with a passive current source as a high-impedance load. While these conventional solutions may offer wide-swing operation, it is generally at the expense of compromising other important operating characteristics.

FIG. 1 is a circuit diagram illustrating a conventional solution for headroom compensation that utilizes a common source p-channel driver transistor Q driven from a low gain first or second stage. An output from the low gain first or second stage is coupled to the gate of the driver transistor Q. Transistor Q has a gate and source that are coupled through a series-connected resistor R and capacitor C. The drain of transistor Q is connected to a power supply voltage Vpwr. The sinking capability is provided by a current source Isink.

There are several disadvantages to conventional solutions represented by the circuit of FIG. 1. For example, the p-channel driver transistor Q must be made physically large in order to result in wide-swing output performance over the intended operating range. This results in reduced small-signal bandwidth performance due to the increased capacitive loading on the stage previous to the output amplifier stage, as well as degraded large-signal recovery performance due to slew rate limiting from the increased capacitive loading. Another disadvantage is the inability to drive the common source p-channel driver transistor Q from a high-performance folded cascode gain stage without an intervening level-shifting circuit. Yet another disadvantage is the inability to provide nonlinear feedback control, which sharply increases the need for headroom compensation as the output p-channel driver transistor Q enters the triode (or ohmic) region.

It would be desirable to have an architecture and method for headroom compensation that includes dynamic transconductance ($g_m$) enhancement of an output stage p-channel driver device using nonlinear local feedback control to automatically compensate for reduced headroom conditions of operation. Embodiments of the invention fulfill these requirements in addition to addressing other disadvantages inherent to the conventional solutions discussed above.

BRIEF DESCRIPTION OF THE DRAWINGS

FIG. 1 is a circuit diagram illustrating a conventional solution for headroom compensation using a common source output stage driven from a low gain first or second stage.

DETAILED DESCRIPTION OF THE INVENTION

Figure 2:
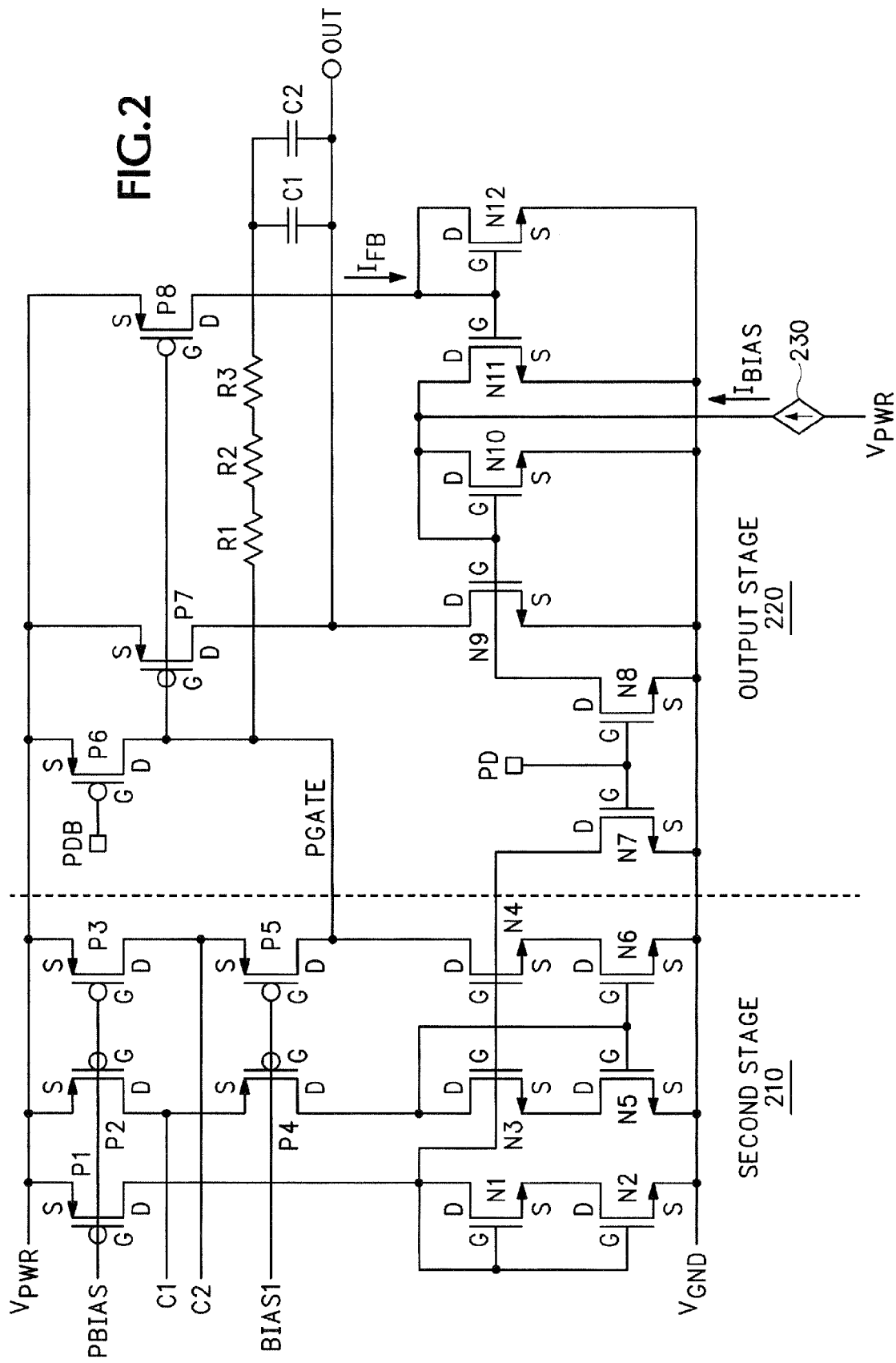
FIG. 2 is a circuit diagram illustrating a dynamic $g_m$ enhancement output stage being driven by a high-performance folded cascode second stage according to some embodiments of the invention.

An improved architecture and method for headroom compensation is described using an exemplary embodiment of the invention. The improved architecture and method provided by embodiments of the invention may be used to allow a common-source output stage to swing nearly completely between power supplies using nonlinear local feedback headroom compensation to dynamically control output driver transistor transconductance. Embodiments of the invention may achieve a low-distortion, wide-swing output drive with a physically smaller driver transistor while simultaneously compensating for reduced headroom operating conditions.

FIG. 2 is a circuit diagram illustrating a dynamic $g_m$ enhancement output stage 220 being driven by a high-performance folded cascode second stage 210 according to some embodiments of the invention. As is known by those of ordinary skill, a "cascode" refers to a two transistor configuration where a common emitter/source stage is followed by a common base/gate stage. Similarly, it is recognized that a "folded cascode" stage is an operational transconductance amplifier (OTA) design that utilizes cascodes. The folded cascode stage 210 illustrated in FIG. 2 is presented as an example only, other folded cascode stage designs exist that may work equally well in other embodiments of the invention.

As illustrated in FIG. 2, the high-performance folded cascode second stage 210 includes p-channel transistors P1, P2, P3, P4, and P5. The sources of transistors P1, P2, and P3 are coupled to the power supply voltage $V_{PWR}$. The sources of transistors P4 and P5 are coupled to the drains of transistors P2 and P3, respectively.

The gates of transistors P1, P2, and P3 are connected to the PBIAS signal, while the gates of transistors P4 and P5 are connected to the BIAS1 signal. The PBIAS and BIAS signals may be outputs from a biasing circuit (not shown).

The signal C1 is connected to the circuit node between the drain of transistor P2 and the source of transistor P4, while signal C2 is connected to the circuit node between the drain of transistor P3 and the source of transistor P5. The signals C1 and C2 may be output from a low-gain operational amplifier stage (not shown).

The second stage 210 also includes the n-channel transistors N1, N2, N3, N4, N5, and N6. The transistors N1 and N2 are series connected between the drain of transistor P1 and the reference voltage $V_{GND}$. The gates of transistors N1, N2, N3, and N4 are connected to the circuit node between the transistors P1 and N1.

The transistors N3 and N5 are series connected between the drain of transistor P4 and the reference voltage $V_{GND}$. The gates of transistors N5 and N6 are commonly connected to the circuit node between the drain of transistor P4 and the drain of transistor N3.

The transistors N4 and N6 are series connected between the drain of transistor P5 and the reference voltage $V_{GND}$.

As illustrated in FIG. 2, an exemplary dynamic $G_m$-enhancement output stage 220 according to some embodiments of the invention includes the p-channel transistors P6, P7, and P8. The output stage 220 also includes the n-channel transistors N7, N8, N9, N10, N11, and N12.

The gate of transistor P6 is connected to the signal PDB. The gates of the transistors P7 and P8 are connected to the circuit node between transistors P5 and N4 of the second stage 210, which carries the signal PGATE. The sources of transistors P6, P7, and P8 are coupled to the power supply voltage $V_{PWR}$.

The gates of transistors N7 and N8 are connected to the signal PD. The drain of transistor N8, the gates of transistors N9 and N10, and the drains of transistors N10 and N11 are commonly connected. The gates of transistors N11 and N12 are commonly connected to the drain of transistor N12.

The sources of transistors N7, N8, N9, N10, N11, and N12 are connected to the reference voltage $V_{GND}$.

The signal PD is a power-down signal and the signal PDB is an inverted version of the PD signal. When the PD signal is high and the PDB signal is low, the output stage 220 is effectively disconnected from the second stage 210.

The output signal OUT from the output stage 220 is taken from the circuit node between the drain of transistor P7 and the drain of transistor N9. The circuit node carrying the output signal OUT is also connected to the circuit node carrying the PGATE signal by the series combination of resistors R1, R2, R3, and two parallel-connected capacitors C1 and C2.

Design flexibility is achieved by using three individual resistors R1, R2, and R3, rather than a single resistor with a resistance equal to R1+R2+R3. For example, if necessary, the voltage across the series combination R1+R2+R3 could be changed by shorting one or more of the resistors R1, R2, and R3.

As illustrated in FIG. 2, the output stage 220 has transistor pairs (P7, P8), (N9, N10), and (N11, N12) that are arranged in a current-mirror configuration. That is, each of the transistors in the transistor pairs (P7, P8), (N9, N10), (N11, N12) has the same voltage $V_{GS}$ appearing across the gate and the source of the transistor, because the gate and source terminals of each transistor pair are connected in parallel.

In a 1:1 current mirror configuration, the transistors in the transistor pair are exactly matched devices and the current through one of the transistors in the transistor pair (the reference device) is exactly replicated by the other transistor in the transistor pair (the biasing device). However, other current mirror designs may reproduce the reference current at a different ratio by adjusting the relative sizes of the transistors in the transistor pair. For example, a biasing transistor that has a width over length ratio that is 3 times larger than the reference transistor will produce a bias current that is three times larger than the reference current, thus achieving a 3:1 current ratio.

In the embodiments illustrated in FIG. 2, the transistor N10 is exactly matched to the transistor N11, the transistor N12 is six times larger than the transistor N11, and the transistor N9 is eight times larger than the transistor N10. In other words, the size ratio between the transistors N9:N10:N11:N12 is 8:1:1:6. Thus, in the current mirror formed by transistors N11 and N12, the current through the bias transistor N11 compared to the current through the reference transistor N12 is 1:6. Similarly, in the current mirror formed by transistors N9 and N10, the current through the bias transistor N9 compared to the current through the reference transistor N10 is 8:1. It should be apparent that the actual ratios used are design choices which may be altered to achieve the desired results for a wide variety of applications.

The current mirror formed by the transistor pair (P7, P8) may also be adjusted by changing the relative sizes of the transistors.

According to the embodiments of the invention illustrated in FIG. 2, the transistor N9 acts as an n-channel sinking driver device and the transistor P7 acts as a p-channel sourcing driver device. The n-channel sinking driver device N9 actively senses the operating region and level of drive current in the p-channel sourcing driver device P7 by using the feedback current $I_{FB}$. The feedback current $I_{FB}$ is produced by transistor P8, which functions as a monitor current mirror for the transistor P7. The transistor P8 may also be referred to as a feedback transistor.

As was explained above, the feedback current $I_{FB}$ is mirrored at a six-to-one ratio by the n-channel current mirror formed by the transistors N11 and N12. Thus, the current through the transistor N11 is ($I_{FB}/6$), or one-sixth of the feedback current $I_{FB}$. In order to calculate the current flowing through the transistor N10 of current mirror (N9, N10), the current through the transistor N11 is subtracted from the bias current $I_{BIAS}$ produced by the current source 230, in accordance with Kirchoff's Current Law (KCL). Thus, the current flowing through the transistor N10 is equivalent to $[I_{BIAS}-(I_{FB}/6)]$. The current through the transistor N10 is reproduced at an 8:1 ratio by the n-channel sinking driver device N9. Thus, the current through the transistor N10 is multiplied by a factor of 8 to calculate the current through the transistor N9. Therefore, the current through transistor N9 is $8*[I_{BIAS}-(I_{FB}/6)]$.

With the configuration illustrated in FIG. 2, the n-channel sinking driver device N9 may sense when the p-channel sourcing driver device P7 crosses from the saturation (or pinch-off) region to the triode (or ohmic) region and the demanded sourcing current exceeds a certain range. In response, the behavior of the n-channel sinking driver device N9 is actively and dynamically changed to raise the transconductance of the p-channel sourcing device P7. Thus, the embodiments illustrated in FIG. 2 provide a local, nonlinear, feedback control loop.

The local feedback control described above provides $g_m$ enhancement of the p-channel sourcing driver device P7 in such a way that it may operate with acceptable linearity to within 100 mV of the power supply voltage $V_{PWR}$ under full loading conditions. By changing relative device sizes, embodiments of the invention may also be extended to alter other output stage operating characteristics, such as increased output loading currents, improved linearity, or improved output voltage range.

This improved architecture and method presents an improved dynamic wide-swing output stage with dynamically enhanced effective $g_m$ enhancement in order to improve the dynamic voltage range of the output stage under constant or variable loading conditions, and/or constant or variable power supply voltage. This method utilizes nonlinear local feedback control which cuts in sharply when needed, but is otherwise transparent to circuit operation. This is achieved without sacrificing or adversely affecting the performance characteristics of the preceding folded-cascode second stage 210, which drives the output stage 220. These performance characteristics may include the overall operational amplifier ("op amp") gain, bandwidth, input offset voltage, and slew rate.

The nonlinear local feedback control provided by embodiments of the invention eliminates the need to use a very large output sourcing driver device, which would adversely affect the performance characteristics described above, and it also results in a smaller output driver physical size in order to achieve the desired performance.

Operational amplifiers that incorporate the improved output stage according to embodiments of the invention may maintain adequate performance under extreme operating conditions that may occur due to a low supply voltage, an elevated operating temperature, or variability in the integrated circuit manufacturing process.

This improved output stage 220 allows linear low-distortion operation of the p-channel sourcing driver device P7 to within 100 millivolts (mV) of the power supply under full loading conditions while being driven from a high performance folded cascode gain stage 210, which has inherently limited headroom. The particular folded cascode stage 210 helps minimize the overall op amp input offset voltage due to its high open loop voltage gain. Although the folded cascode second stage 210 illustrated in FIG. 2 is preferably used with the improved output stage 220 to preserve the advantages of high voltage gain and wide bandwidth inherent in the folded cascode second stage, it is not required in order to realize the benefits of the improved output stage.

In an alternative embodiment the improved method and architecture provides an advantage over conventional technology methods for output stage design which may use a larger output sourcing p-channel device to achieve the same objective. This method actively and dynamically corrects for the deficiencies of the conventional method while using a smaller-channel sourcing driver device, and while being driven from a high performance folded-cascode 2nd stage. The conventional method sacrifices small-signal bandwidth performance, large-signal slew rate performance, and constrains the operating range of the preceding 2nd stage, which drives it. In another alternative embodiment, this method and topology may be extended to other output stage operating characteristics, such as higher output loading currents, or improved linearity or output voltage range requirements by changing the relative device sizes within this invention method.

Advantages of this improved circuit include substantial layout area savings, particularly in applications such as active filters and feedback control systems. While in one exemplary embodiment this improved circuit and method may be implemented using a BiCMOS process, it may also be implemented in any CMOS process. Furthermore, although the exemplary embodiments illustrated in FIG. 2 include only field effect transistors (FETs), other embodiments of the invention may be implemented using bipolar junction transistors (BJTs). In such a case, the connections for the gate, source, and drain terminals of the FET would correspond to the connections for the base, emitter, and collector terminals, respectively, of the BJT.

Embodiments of the invention may be practiced in many ways. What follows are some exemplary, non-limiting descriptions of some embodiments of the invention.

According to some embodiments of the invention, a circuit having an output node includes a first transistor having a drain coupled to the output node, a second transistor having a drain coupled to the output node, and a nonlinear feedback loop coupled to the first and second transistors, the nonlinear feedback loop structured to enable the first transistor to sense a region of operation of the second transistor, the first transistor structured to alter the transconductance of the second transistor in response to the sensed region of operation.

According to some embodiments of the invention, the nonlinear feedback control loop includes a third transistor having a gate connected to a gate of the second transistor and having a source connected to a source of the second transistor, a first current mirror coupled to a drain of the third transistor, and a fourth transistor having a gate connected to a gate of the first transistor and having a source connected to a source of the first transistor, the first and fourth transistors forming a second current mirror.

According to some embodiments of the invention, the first current mirror is structured to mirror a current from the drain of the third transistor by a ratio.

According to some embodiments of the invention, the ratio is approximately 6:1.

According to some embodiments of the invention, the first current mirror includes a fifth transistor having a gate connected to the drain of the third transistor and having a drain connected to the gate of the fifth transistor, and a sixth transistor having a gate connected to the gate of the fifth transistor.

According to some embodiments of the invention, the second and third transistors are p-channel transistors.

According to some embodiments of the invention, the first, fourth, fifth, and sixth transistors are n-channel transistors.

According to some embodiments of the invention, the circuit includes a current source coupled to a drain of the fourth transistor and a drain of the sixth transistor.

According to some other embodiments of the invention, an output stage structured to be driven by a preliminary stage includes a sourcing transistor coupled to an output of the preliminary stage, a first current mirror coupled to the sourcing transistor, and a nonlinear feedback loop between the sourcing transistor and the first current mirror.

According to some embodiments of the invention, the nonlinear feedback loop includes a feedback transistor connected in parallel to an input port of the sourcing transistor, and a second current mirror that is structured to mirror a current from the feedback transistor at a selected ratio, the second current mirror coupled to the first current mirror.

According to some embodiments of the invention, the first current mirror includes a sinking transistor, the sinking transistor structured to dynamically alter the transconductance of the sourcing transistor in response to the current from the feedback transistor.

According to some embodiments of the invention, the sourcing transistor, the sinking transistor, and the feedback transistor are FETs.

According to some embodiments of the invention, a gate of the sourcing transistor is connected to a gate of the feedback transistor, a source of the sourcing transistor is connected to a source of the feedback transistor, and a drain of the sourcing transistor is connected to a drain of the sinking transistor.

According to some embodiments of the invention, the sourcing transistor, the sinking transistor, and the feedback transistor are BJTs.

According to some embodiments of the invention, a base of the sourcing transistor is connected to a base of the feedback transistor, an emitter of the sourcing transistor is connected to an emitter of the feedback transistor, and a collector of the sourcing transistor is connected to a collector of the sinking transistor.

According to some embodiments of the invention, the output stage further includes a current source structured to contribute a current to a node between the first and the second current mirrors.

According to still other embodiments of the invention, a method includes driving a sourcing transistor in an output stage with a preliminary stage, coupling the sourcing transistor to a driving transistor, and dynamically altering the transconductance of the sourcing transistor by monitoring a feedback current in a nonlinear feedback loop between the sourcing transistor and the driving transistor.

According to some embodiments of the invention, monitoring the feedback current includes mirroring the feedback current at a first selected ratio with a first current mirror to produce an intermediate current.

According to some embodiments of the invention, monitoring the feedback current further includes mirroring the intermediate current at a second selected ratio with a second current mirror to produce a bias current through the driving transistor.

According to some embodiments of the invention, monitoring the feedback current includes producing the feedback current by mirroring the current through the sourcing transistor at a first selected ratio.

It should be appreciated that reference throughout this specification to "one embodiment" or "an embodiment" or "some embodiments" means that a particular feature, structure or characteristic described in connection with the embodiment is included in at least one embodiment of the invention. Therefore, it is emphasized and should be appreciated that two or more references to "an embodiment" or "one embodiment" or "an alternative embodiment" or "some embodiments" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure, aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

I claim:

1. An output stage structured to be driven by a preliminary stage, the output stage comprising:
    a sourcing transistor coupled to an output of the preliminary stage;
    a first current mirror coupled to the sourcing transistor, the first current mirror including a sinking transistor, the sinking transistor structured to dynamically alter the transconductance of the sourcing transistor in response to a current from a feedback transistor; and
    a nonlinear feedback loop between the sourcing transistor and the first current mirror, the nonlinear feedback loop including
        the feedback transistor, the feedback transistor and the sourcing transistor arranged in a current mirror configuration, and
        a second current mirror that is structured to mirror a current from the feedback transistor at a selected ratio, the second current mirror coupled to the first current mirror.

2. The output stage of claim 1, the sourcing transistor, the sinking transistor, and the feedback transistor comprising FETs.

3. The output stage of claim 2, wherein:
    a gate of the sourcing transistor is connected to a gate of the feedback transistor;
    a source of the sourcing transistor is connected to a source of the feedback transistor; and
    a drain of the sourcing transistor is connected to a drain of the sinking transistor.

4. The output stage of claim 1, wherein:
    the sourcing transistor, the sinking transistor, and the feedback transistor comprise BJTs;
    a base of the sourcing transistor is connected to a base of the feedback transistor;
    an emitter of the sourcing transistor is connected to an emitter of the feedback transistor; and
    a collector of the sourcing transistor is connected to a collector of the sinking transistor.

5. The output stage of claim 1, further comprising a current source structured to contribute a current to a node between the first and the second current mirrors.

6. A method comprising:
    driving a sourcing transistor in an output stage with a preliminary stage, the sourcing transistor coupled to a driving transistor at an output node of the output stage, the sourcing transistor coupled to a feedback transistor in a current mirror configuration such that a voltage across an input port of the sourcing transistor is the same as a voltage across an input port of the feedback transistor;
    dynamically altering the transconductance of the sourcing transistor by mirroring a sourcing current through the sourcing transistor with the feedback transistor to produce a feedback current in a nonlinear feedback loop between the sourcing transistor and the driving transistor;
    mirroring the feedback current at a first selected ratio with a first current mirror to produce an intermediate current; and
    mirroring the intermediate current at a second selected ratio with a second current mirror to produce a bias current through the driving transistor.

7. The method of claim 6, wherein mirroring the sourcing current comprises mirroring the sourcing current at a first selected ratio.

8. A circuit that includes an output node and nonlinear devices, each of the nonlinear devices including three terminals, an input port, and an output port, the input port and output port each consisting of two of the three terminals and each sharing one of the three terminals with the other, the circuit comprising:
    a first current mirror, the first current mirror including a first one of the nonlinear devices and a second one of the nonlinear devices, the first one and the second one of the nonlinear devices arranged to have the same voltage across their input ports, a first terminal of the first one of the nonlinear devices coupled to the output node;
    a second current mirror, the second current mirror including a third one of the nonlinear devices and a fourth one of the nonlinear devices, the third one and the fourth one of the nonlinear devices arranged to have the same voltage across their input ports, a first terminal of the third one of the nonlinear devices coupled to the output node; and
    a third current mirror, the third current mirror including a fifth one of the nonlinear devices and a sixth one of the nonlinear devices, the fifth one and the sixth one of the nonlinear devices arranged to have the same voltage across their input ports, a first terminal of the fifth one of the nonlinear devices and a first terminal of the fourth one of the nonlinear devices coupled to a common circuit node.

9. The circuit of claim 8, the third current mirror arranged to mirror a current from a first terminal of the second one of the nonlinear devices by a ratio.

10. The circuit of claim 9, further comprising a current source arranged to supply a current to the common circuit node.

11. The circuit of claim 10, each of the first, second, third, fourth, fifth, and sixth ones of the nonlinear devices consisting of a Bipolar Junction Transistor (BJT).

12. The circuit of claim 10, each of the first, second, third, fourth, fifth, and sixth ones of the nonlinear devices consisting of a Field Effect Transistor (FET).

13. The circuit of claim 12, each of the first and second ones of the nonlinear devices consisting of a p-channel FET.

14. The circuit of claim 12, each of the third, fourth, fifth, and sixth ones of the nonlinear devices consisting of a n-channel FET.

* * * * *